United States Patent [19]

Podell et al.

[11] Patent Number: 4,908,531
[45] Date of Patent: Mar. 13, 1990

[54] MONOLITHIC ACTIVE ISOLATOR

[75] Inventors: Allen F. Podell, Palo Alto; Sanjay B. Moghe, San Jose; Fazal Ali, Santa Clara, all of Calif.

[73] Assignee: Pacific Monolithics, Sunnyvale, Calif.

[21] Appl. No.: 246,425

[22] Filed: Sep. 19, 1988

[51] Int. Cl.$^4$ .................... H03K 17/04; H03K 17/687
[52] U.S. Cl. .................... 307/571; 307/475; 307/246; 307/581; 307/304
[58] Field of Search .................... 307/475, 571–573, 307/448, 304, 317 A, 574, 575, 581, 584, 270; 330/277

[56] References Cited

U.S. PATENT DOCUMENTS

| | | | |
|---|---|---|---|
| 3,392,341 | 7/1968 | Burns | 330/277 |
| 4,492,883 | 1/1985 | Janutka | 307/571 |
| 4,511,815 | 4/1985 | Wood | 307/584 |
| 4,633,097 | 12/1986 | Dewitt | 307/246 |
| 4,679,010 | 7/1987 | Bahl | 333/109 |
| 4,691,129 | 9/1987 | Einzinger et al. | 307/574 |

OTHER PUBLICATIONS

Scholoemann, "Circulators for Microwave and Millimeter-Wave Integrated Circuits", *Proceedings of the IEEE*, vol. 76, No. 2, Feb. 1988, pp. 188–200.

Bahl, "On The Design of an Active Circulator", *Microwave and Optical Technology Letters*, vol. 1, No. 1, Mar. 1988, pp. 18–20.

Smith, Mark A., "GaAs Monolithic Implemetation on of Active Circulators", 1988 *IEEE MTT-S Digest*, Mar. 1988, pp. 1015–1016.

Bahl, "The Design of a 6–Port Active Circulator", 1988 *IEEE MTT-S Digest*, Mar. 1988, pp. 1011–1014.

*Primary Examiner*—Stanley D. Miller
*Assistant Examiner*—Timothy P. Callahan
*Attorney, Agent, or Firm*—Edward B. Anderson

[57] ABSTRACT

A push-pull monolithic active isloator having a pair of MESFETs in common-gate and common-drain (source follower), parallel configuration. These two FETs are the same size and a diode is inserted between the gate of the source follower and the source of the common-gate FET. A D.C. blocking capacitor is included at the output. Another FET is coupled between the input and ground and responsive to a control signal to vary the current in a biasing resistor between the drain and gate of the source follower.

12 Claims, 4 Drawing Sheets

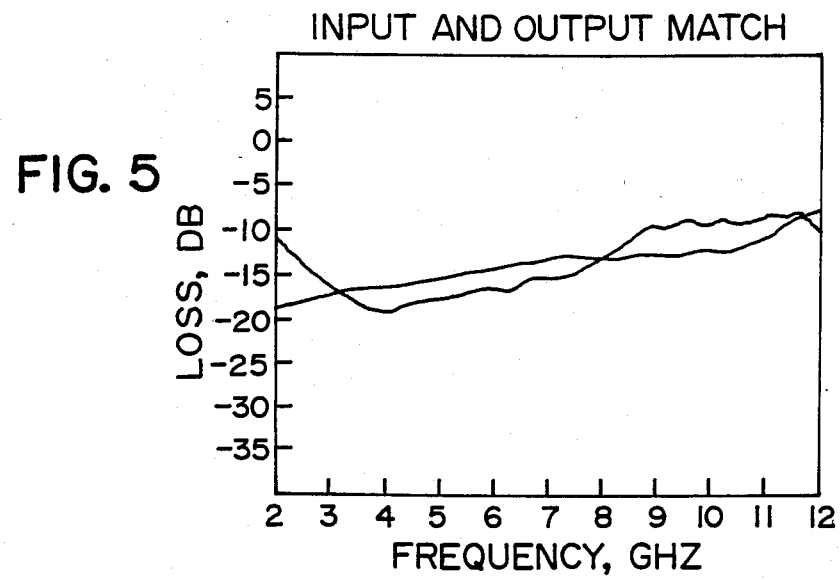
FIG. 5 INPUT AND OUTPUT MATCH
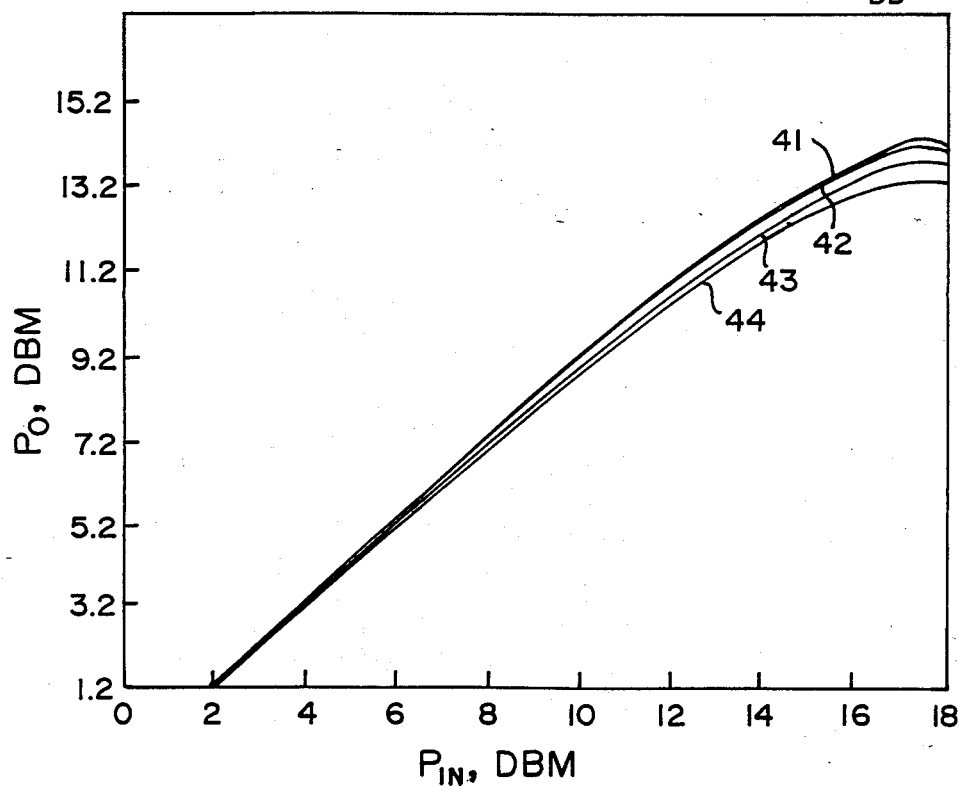
FIG. 6 INPUT POWER VS. OUTPUT POWER AT 4 GHZ FOR DIFFERENT VALUES OF $V_{DD}$

4,908,531

MONOLITHIC ACTIVE ISOLATOR

FIELD OF THE INVENTION

This invention relates to isolators for isolating cascaded circuit components, and particularly to such isolators comprising active elements to provide for fabrication on a monolithic chip.

BACKGROUND OF THE INVENTION

Isolators are devices that allow microwave energy to pass in one direction with little loss but absorb power in the reverse direction. They minimize reflections between cascaded components with different impedances. Isolators are generally made from circulators with one port connected to a 50 ohm impedance. Such isolators are made of ferrite passive devices. In monolithic circuit applications, they are made of hybrid integrated circuits and tend to be very bulky in that they are one or two orders of magnitude larger than the associated cascaded circuits.

In microwave applications, it is desirable to have an isolator which can be fabricated on a monolithic chip, particularly GaAs, along with the circuit components to be cascaded. Heretofore, this has not been possible with conventional isolators.

SUMMARY OF THE INVENTION

The present invention overcomes this shortcoming of the prior art by providing an isolator which can be fabricated on a monolithic chip. In particular, this is provided by an isolator formed of active elements. In the preferred embodiment, these active elements are FETs.

According to the present invention, an active isolator circuit is provided for electrically isolating an input terminal from an output terminal. A common-gate transistor has a gate coupled to ground, a source coupled to the input terminal, and a drain coupled to the output terminal. A source-follower transistor has a gate coupled to the source of the common-gate transistor, a drain coupled to a voltage source, and a source coupled to the drain of the common-gate transistor.

This basic circuit forms an isolator which may be fabricated on a GaAs substrate, is very small, and provides the desired impedance matching for use in monolithic systems. These and other features and advantages of the present invention will become apparent from a review of the drawings and the following detailed description of the preferred embodiment.

BRIEF DESCRIPTION OF THE DRAWINGS

FIG. 5 is a graph also similar to that of FIG. 3 showing the input and output match.

FIG. 6 is a graph showing a mapping of input power versus output power for several values of source voltages at 4 GHz frequency.

DETAILED DESCRIPTION OF THE PREFERRED EMBODIMENT

In the following discussion a preferred embodiment is described using field effect transistors. It will be understood that other variations of the circuit may be used, such as using bipolar transistors or high electron mobility transistors (HEMT's), without departing from the invention as described in the claims.

Figure 1:
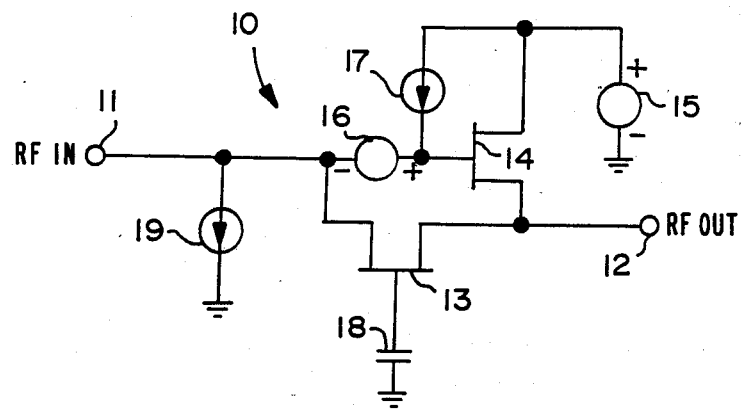
FIG. 1 is a generalized circuit diagram of an isolator made according to the invention.

Referring initially to FIG. 1, a basic circuit of an active isolator 10 is shown for single-ended operation. Isolator 10 couples an input terminal 11 to an output terminal 12. A common-gate transistor 13 has a source coupled to the input terminal. The gate is coupled to ground through a capacitor 18. The drain is coupled to output terminal 12. A second transistor 14 has a drain coupled to a supply voltage 15. Its source is directly coupled to the drain of transistor 13 and output terminal 12 in a source-follower configuration. The gate is coupled to input terminal 11 and the source of transistor 13 through a level shifter 16. A current source 17 is positioned between the drain and gate of transistor 14. A second current source 19 is coupled to the source of transistor 13. As will be seen, isolator 10 provides a basic building block for preferred isolators made according to the invention.

Figure 2:
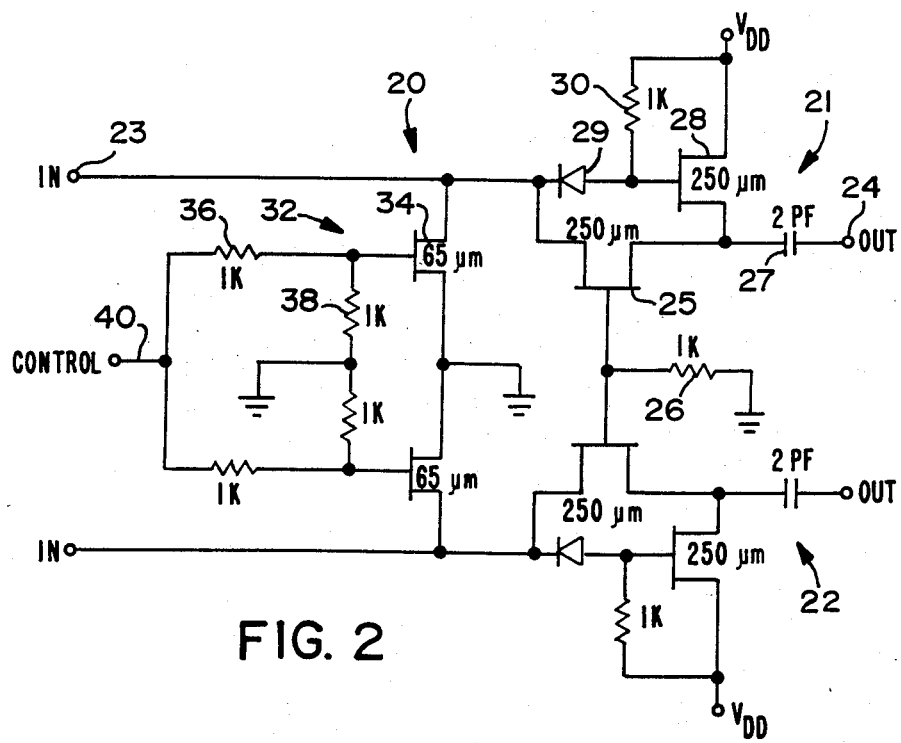
FIG. 2 is a circuit schematic of a preferred push-pull isolator incorporating the isolator of FIG. 1.

In particular, FIG. 2 illustrates a push-pull monolithic active isolator 20 formed of two matched individual isolators shown generally at 21 and 22, each similar to isolator 10 shown in FIG. 1. This preferred embodiment was designed for use in a push-pull application. This, however, is not required for operation of individual isolator 10. In the following discussion, only isolator 21 will be described. Isolator 22 is identical to it, so all comments regarding isolator 21 also apply to isolator 22.

Isolator 21 couples an input terminal 23 to an output terminal 24. Circuit components to be cascaded and having different impedance are coupled to these input and output terminals. A 250 μm common-gate MESFET (a JFET in which the gate electrode has been replaced with a Schottky barrier) 25 has its gate coupled to ground through a 1 kohm resistor 26. This resistor replaces capacitor 18 for push-pull operation. The source is coupled to the input terminal. The drain is coupled through a 2 pF D.C. blocking capacitor 27 to facilitate cascading of circuits with isolator 20.

A second 250 μm MESFET 28 has a drain coupled to a voltage source $V_{DD}$, equivalent to supply 15 of FIG. 1. Its source is directly coupled to the drain of MESFET 25 and output terminal 24 in a source follower configuration. The gate is coupled through a GaAs Schottky barrier diode 29 (providing a level shift function) to the source of MESFET 25, and thereby to the input terminal. Diode 29 ensures a minimum $V_{GS}$ for the source follower MESFET 28. Diode 29 could also be replaced by a parallel RC circuit to provide the level shift function of the diode. A 1 kohm biasing resistor 30 is posed between the drain and gate of transistor 28, which resistor functions as a current supply.

A current source shown generally at 32, equivalent to current source 19 of FIG. 1, is coupled to the cathode of diode 28. This current source is controllable to vary the current passing through resistor 30, and thereby to vary the $V_{GD}$ and $V_{GS}$ of transistor 28. This is particularly useful to compensate for variances in circuit component values resulting from process variances during fabrication. Included is a 65 μm MESFET 34 having a common source and a drain coupled to the diode. The gate of MESFET 34 is coupled to a voltage divider formed of 1 kohm resistors 36 and 38. A control voltage is applied at a terminal 40 on one end of the voltage divider. FET 34 may be replaced by an inductor and a resistor without any effect on the circuit performance. With the shunt inductor/resistor, the current variation is less controllable.

Figure 3:
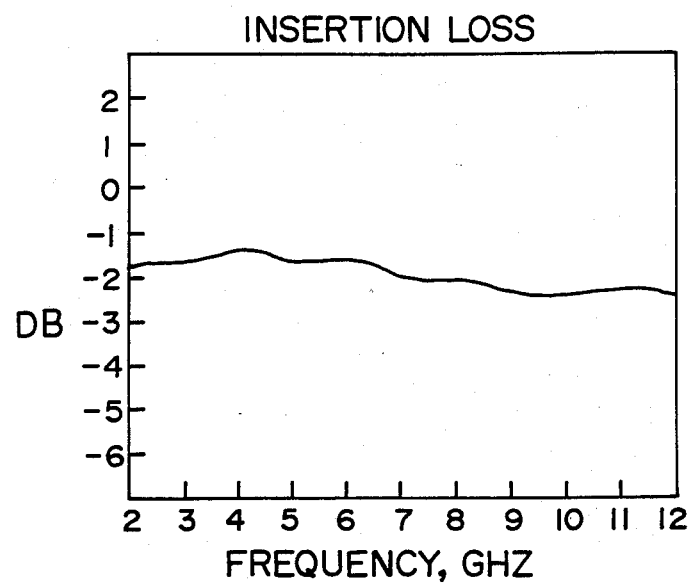
FIG. 3 is a graph of the insertion loss of the circuit of FIG. 2 for a range of microwave frequencies.
Figure 4:
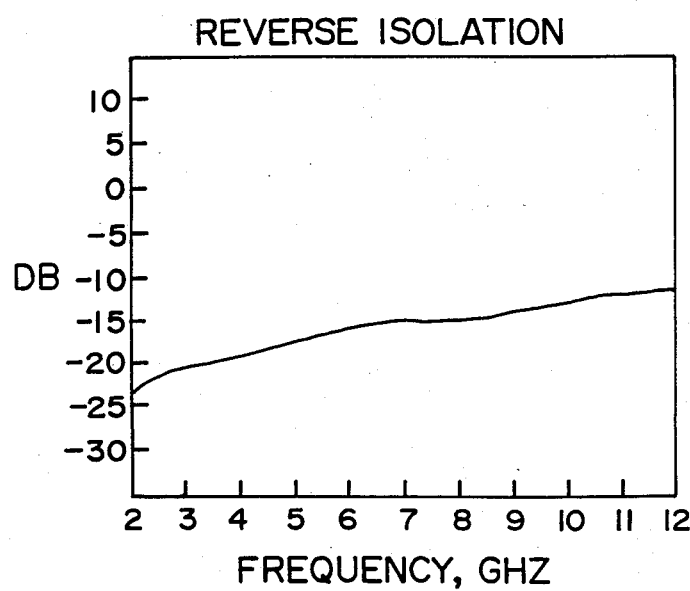
FIG. 4 is a graph similar to that of FIG. 3 of the reverse isolation.

The operation of isolator 12 is illustrated in FIGS. 3-7. As shown in FIG. 3, it has an insertion loss of 1.5 dB up to 6 GHz and 2.2 dB at higher frequencies. It has better than 18 dB reverse isolation up to 6 GHz and 14 dB of isolation at the higher end of the band, as is illustrated in FIG. 4. The input and output matches (return losses) are greater than 10dB as shown in FIG. 5. The data for these graphs was taken at a supply voltage of 5 v and a current of 20 mA. By using HEMT's as the active devices, the frequency of operation of an active isolator can be extended to 30 GHz.

FIG. 6 illustrates the output power as a function of input power at 4.0 GHz with zero gate bias for various source voltages. Upper curve 41 is at a supply voltage of 6.5 volts. Curves 42, 43, and 44 are respectively the curves for supply voltages of 6.0, 5.5, and 5.0 volts. The measured output power of the isolator at 1 dB gain compression point is +13 dBm.

Figure 7A:
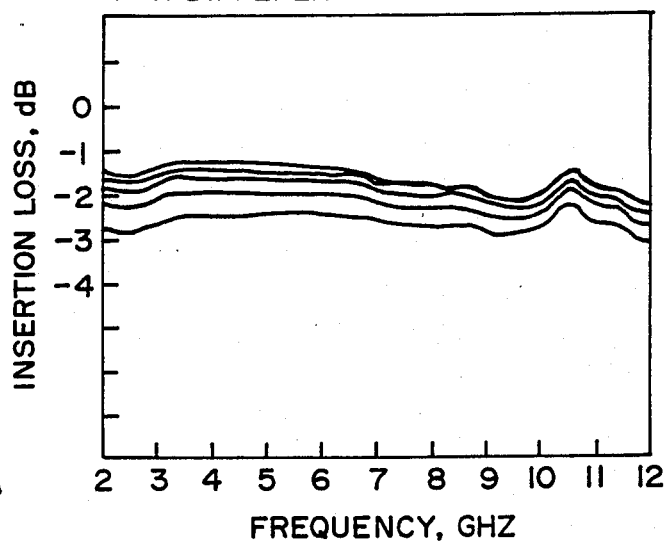
FIGS. 7A and 7B are graphs showing changes in insertion loss and isolation as the control voltage of the circuit of FIG. 2 is varied.
Figure 7B:
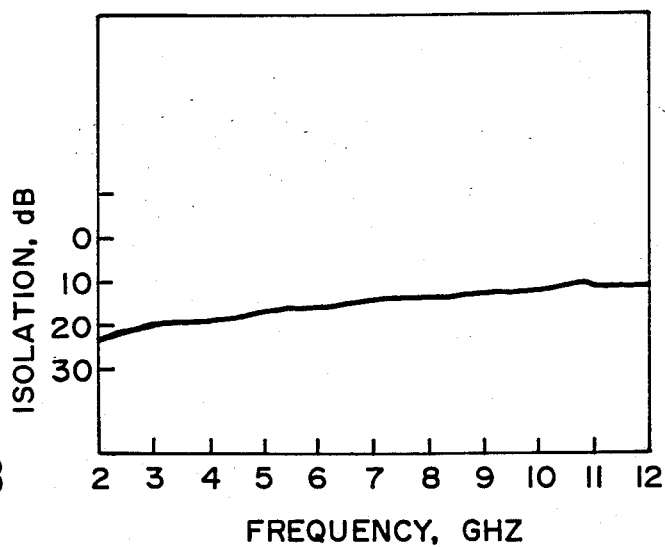

FIGS. 7A and 7B show the change in insertion loss and isolation for various bias control voltages applied to control voltage terminal 40 over the frequency range of 2 GHz to 12 GHz. The lower curve in FIG. 7A is associated with a control voltage of 0 volts. The upper curves resulted from applying an increasing amount of negative voltage to the control terminal.

It can be seen that for approximately 1 dB reduction in insertion loss there was the same magnitude of change in the isolation. Thus, control of insertion loss is provided without substantially impacting the isolation. This feature is particularly advantageous for accommodating process variations resulting from the manufacture of monolithic integrated circuits. FET parameters are very sensitive and can only be made within a range of accuracy. By making the biasing adjustable, the circuit can be brought within desired specifications after manufacturing.

Circuit 20 was fabricated on a 20 mil thick GaAs substrate without the use of via holes. It occupies a very small chip size (0.010 × 0.020 inches), making it ideal for impedance matching in monolithic systems. The isolator may be directly integrated into an MMIC or used in between MIC amplifiers where a ferrite isolator is not practical.

It can be seen that the circuit of the invention provides an effective isolator using active elements which permits fabrication on a monolithic chip. Although the invention has been described with reference to the foregoing preferred embodiment, it will be appreciated that variations may be made without varying from the scope and spirit of the invention as defined in the claims.

We claim:
1. An active isolator circuit for electrically isolating an input terminal from an output terminal comprising:
   a common-gate transistor means having a gate means coupled to ground, a source means coupled to the input terminal, and a drain means coupled to the output terminal; and
   a source-follower transistor means having a gate means coupled to said source means of said common-gate transistor means, a drain means coupled to a voltage source, and a source means coupled to said drain means of said common-gate transistor means.

2. A circuit according to claim 1 further comprising level shift means posed between said gate means of said source-follower transistor means and said source means of said common-gate transistor means, said level shift means providing a minimum voltage between said gate means and said source means of said source-follower transistor means.

3. A circuit according to claim 1 wherein both of said transistor means are high electron mobility transistors (HEMTs).

4. A circuit according to claim 1 wherein both of said transistor means are unipolar transistors.

5. A circuit according to claim 4 wherein said transistors are MESFETs.

6. A circuit according to claim 1 further comprising means for biasing said common-gate transistor means and said source-follower transistor means in a manner maintaining a minimum voltage level between said gate of said source-follower transistor means and said source of said common-gate transistor means.

7. A circuit according to claim 6 characterized by an input impedance at the input terminal and an output impedance at the output terminal, wherein said biasing means is responsive to a control signal for varying the bias of said source-follower transistor means, and thereby the input and output impedances of said circuit.

8. A circuit according to claim 7 wherein said biasing means comprises biasing impedance means posed between said gate means and drain means of said source-follower transistor means, and current source means coupled to said gate means of said source-follower transistor means responsive to the control signal for varying the magnitude of the current in said impedance means.

9. A circuit according to claim 1 wherein said transistor means are configured for single-ended operation of said isolator circuit.

10. A circuit according to claim 1 further comprising second ones of said common-gate and source-follower transistor means configured to provide push-pull operation of said isolator circuit.

11. An active isolator circuit for electrically isolating an input terminal from an output terminal comprising:
   a common-gate MESFET having a gate coupled to ground, a source coupled to the input terminal, and a drain coupled to the output terminal;
   a source-follower MESFET having a gate coupled to said source of said common-gate MESFET, a drain coupled to a voltage source, and a source coupled to said drain of said common-gate MESFET; and
   a diode posed between said source of said common-gate MESFET and said gate of said source-follower MESFET.

12. A circuit according to claim 11 further comprising a biasing resistor between the voltage source and said gate of said source-follower MESFET, and a current-source MESFET having a drain coupled to said source of said common-gate MESFET, a source coupled to ground, and a gate responsive to a control signal for varying the current in said biasing resistor, and thereby the bias voltage on said gate of said source-follower MESFET.

* * * * *